United States Patent
Park

(10) Patent No.: US 6,410,405 B2
(45) Date of Patent: Jun. 25, 2002

(54) METHOD FOR FORMING A FIELD OXIDE FILM ON A SEMICONDUCTOR DEVICE INCLUDING MASK SPACER AND ROUNDING EDGE

(75) Inventor: Myoung Kyu Park, Choongcheongbuk-do (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/895,411

(22) Filed: Jul. 2, 2001

(30) Foreign Application Priority Data

Jun. 30, 2000 (KR) .......................... 2000-36943

(51) Int. Cl.[7] ...................... H01L 21/336; H01L 21/76
(52) U.S. Cl. ................. 438/431; 438/424; 438/430; 438/296; 438/435
(58) Field of Search ............... 438/424, 430, 438/431, 296, 435, 437

(56) References Cited

U.S. PATENT DOCUMENTS

| | | | | |
|---|---|---|---|---|
| 4,666,556 A | * | 5/1987 | Fulton et al. | |
| 6,025,249 A | * | 2/2000 | Kuo | 438/426 |
| 6,143,624 A | * | 11/2000 | Keper et al. | 438/433 |
| 6,184,108 B1 | * | 2/2001 | Omid-Zohoor et al. | 438/431 |
| 6,251,750 B1 | * | 6/2001 | Lee | 438/432 |
| 6,274,455 B1 | * | 8/2001 | Seo | 438/400 |

OTHER PUBLICATIONS

Aoki, M. et al.; "Quarter–micron Selective–Epitaxial–Silicon Refilled Trench (SRT) Isolation Technology with Substrate Shield"; 1991; IEEE; pp. 447–450.*

* cited by examiner

Primary Examiner—John F. Niebling
Assistant Examiner—Ron Pompey
(74) Attorney, Agent, or Firm—Pillsbury Winthrop LLP

(57) ABSTRACT

The present invention provides a method for forming a field oxide film on a semiconductor device. In particular, the present invention provides a method for forming a field oxide film on a semiconductor device using a silicon epitaxial layer to improve a Shallow Trench Isolation (STI) process.

17 Claims, 7 Drawing Sheets

METHOD FOR FORMING A FIELD OXIDE FILM ON A SEMICONDUCTOR DEVICE INCLUDING MASK SPACER AND ROUNDING EDGE

FIELD OF THE INVENTION

The present invention relates to a method for forming a field oxide film on a semiconductor device, and more particularly, to a method for forming a field oxide film on a semiconductor device using a silicon epitaxial layer to improve a Shallow Trench Isolation (STI) process.

BACKGROUND OF THE INVENTION

FIGS. 1A to 1E illustrate, in sectional views, a conventional method for forming a field oxide film on a semiconductor device. As shown in FIG. 1A, a layer of pad oxide film 12, a layer of silicon nitride film 14, and a layer of photoresist film 16 are formed on a silicon substrate 10. The photoresist film 16 is selectively exposed and developed to form a photoresist pattern 16a, as shown in FIG. 1B. The silicon nitride film 14 and the pad oxide film 12 are typically removed sequentially using the photoresist pattern 16a as a mask to form a thermal oxidation mask comprising the silicon nitride film 14a and the pad oxide film pattern 12a. As shown in FIG. 1C, the exposed silicon substrate 10 is then removed to a desired depth using the thermal oxidation mask to form a channel 18, after which the photoresist pattern 16a is removed.

Subsequently, as shown in FIG. 1D, an oxidation process is performed to form rounded corners of the channel 18, and a silicon oxide film 20 is formed on the exposed surface of the channel 18. The entire surface is then coated with a field oxide film 22, e.g., by a Chemical Vapor Deposition (CVD) method, to cover the channel 18. As shown in FIG. 1E, the field oxide film 22 is then selectively removed and planarized, e.g., by a Chemical Mechanical Polishing (CMP) process, using the silicon nitride film pattern 14a as an etching stop film. In a subsequent process, the silicon nitride film pattern 14a is removed by a wet etching process.

However, conventional methods for forming a field oxide film on a semiconductor device have several limitations. For example, the area of active silicon region is reduced during the oxidation process for making rounded channel edges (i.e., corners), typically in the amount of about 0.01 μm width. This reduction of the active silicon region affects the operational characteristics of a cell process significantly, especially for cells having a design rule of 0.1 μm or less. For example, in a cell having an active region width of about 0.1 μm, the width of the active region can be reduced to about 80 nm or less, which reduces the cell current by about 20% or more.

SUMMARY OF THE INVENTION

The present invention provides a method for forming a field oxide film on a semiconductor device. Methods of the present invention substantially obviate one or more problems in conventional field oxide film formation methods.

An object of the present invention is to provide a method of producing a field oxide film on a semiconductor device and minimize the amount of active region reduction during an STI process.

Another object of the present invention is to provide a method of producing a field oxide film on a semiconductor device and minimize the amount of cell current reduction in the resulting semiconductor device.

Yet another object of the present invention is to provide a method of producing a field oxide film on a semiconductor device and reduce the ohmic contact during self-alignment contact, thereby improving the circuit operational speed.

Accordingly, the present invention provides a method for forming a field oxide film on a semiconductor device comprising the steps of:
producing a thermal oxidation mask on a silicon substrate;
producing a channel on said silicon substrate using said thermal oxidation mask;
producing a silicon epitaxial layer on the surface of said silicon substrate channel;
producing a spacer mask on side surfaces of said thermal oxidation mask;
producing a smooth edged silicon epitaxial layer near the interface between said spacer mask and said silicon epitaxial layer; and
producing a field oxide film on said silicon substrate.

In one embodiment of the present invention, the thermal oxidation mask comprises silicon nitride film. The thermal oxidation mask can further comprise a pad oxide film disposed between the silicon substrate and the silicon nitride film.

In another embodiment of the present invention, the spacer mask comprises silicon oxide.

The smooth edged silicon epitaxial layer producing step can include oxidizing the silicon epitaxial layer under conditions sufficient to form a layer of silicon oxide film on the silicon epitaxial layer and the smooth edged silicon epitaxial layer near the interface between the spacer mask and the silicon epitaxial layer. Preferably, the thickness of the silicon epitaxial layer is from about 50 to about 100 Å.

The spacer mask producing step can comprise coating the silicon substrate with a silicon oxide film and removing the silicon oxide film under conditions sufficient to produce the spacer mask. Preferably, the silicon oxide film coating thickness is from about 50 to about 100 Å.

The field oxide film producing step can include producing a layer of field oxide film material on the silicon substrate and planarizing the field oxide film material using the thermal oxidation mask, e.g., silicon nitride film, as an etching stop film. Preferably, field oxide film material is planarized using a CMP process.

Another aspect of the present invention provides a method for forming a field oxide film on a semiconductor device comprising the steps of:
forming a thermal oxidation mask on a silicon substrate, wherein said thermal oxidation mask comprises silicon nitride film;
forming a channel on the exposed regions of said silicon substrate;
forming a silicon epitaxial layer on the surface of said silicon substrate channel;
forming an oxide film spacer mask on side surfaces of said thermal oxidation mask;
forming a smooth edged silicon epitaxial layer near the interface between said oxide film spacer mask and said silicon epitaxial layer by oxidizing the exposed silicon epitaxial layer; and
forming a field oxide film on said silicon substrate.

DETAILED DESCRIPTION OF PREFERRED EMBODIMENTS

The present invention will be described with regard to the accompanying drawings, in particular FIGS. 2A to 2G, which assist in illustrating various features of the present invention. It should be appreciated that the drawings are provided for the purpose of illustrating the practice of the present invention and do not constitute limitations on the scope thereof.

Figure 1A:
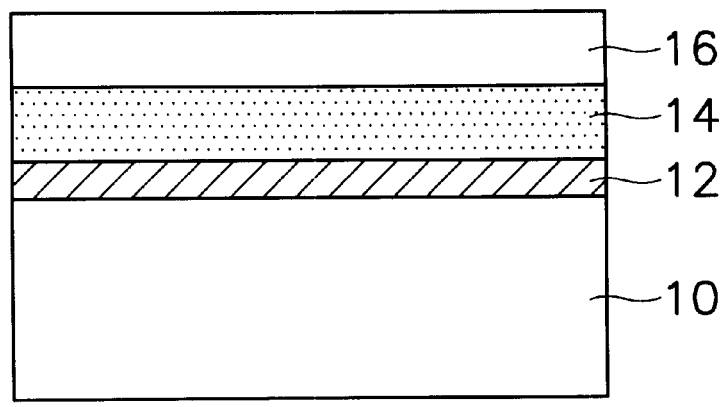
FIGS. 1A to 1E illustrate, in sectional views, a conventional method for forming a field oxide film.
Figure 1B:
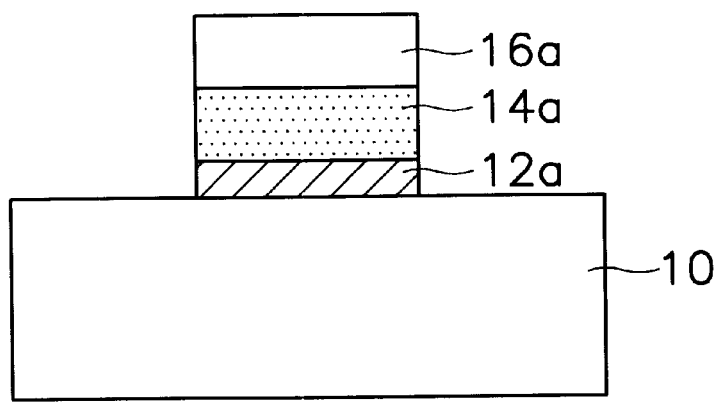
Figure 1C:
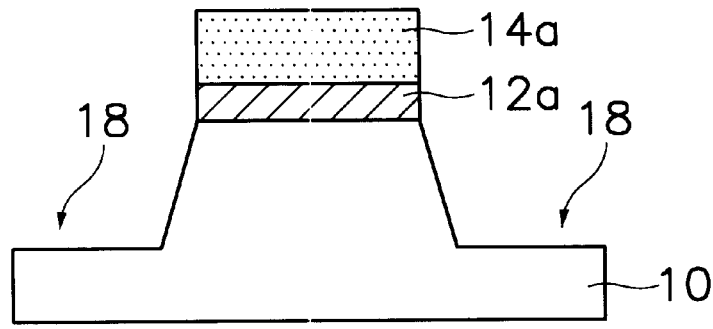
Figure 1D:
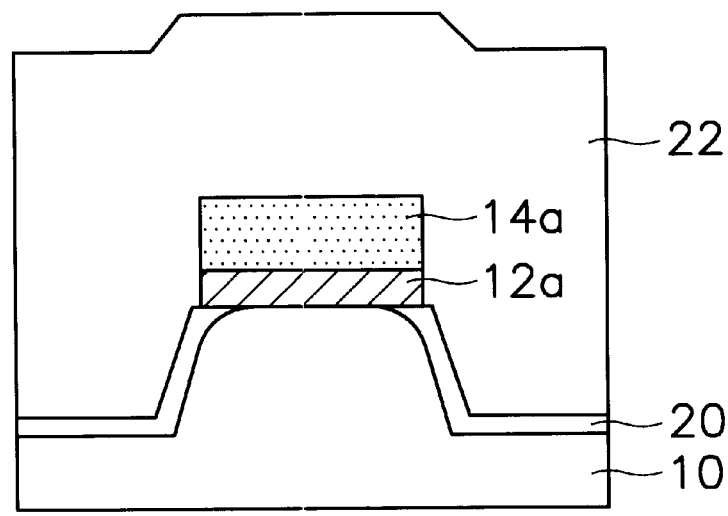
Figure 1E:
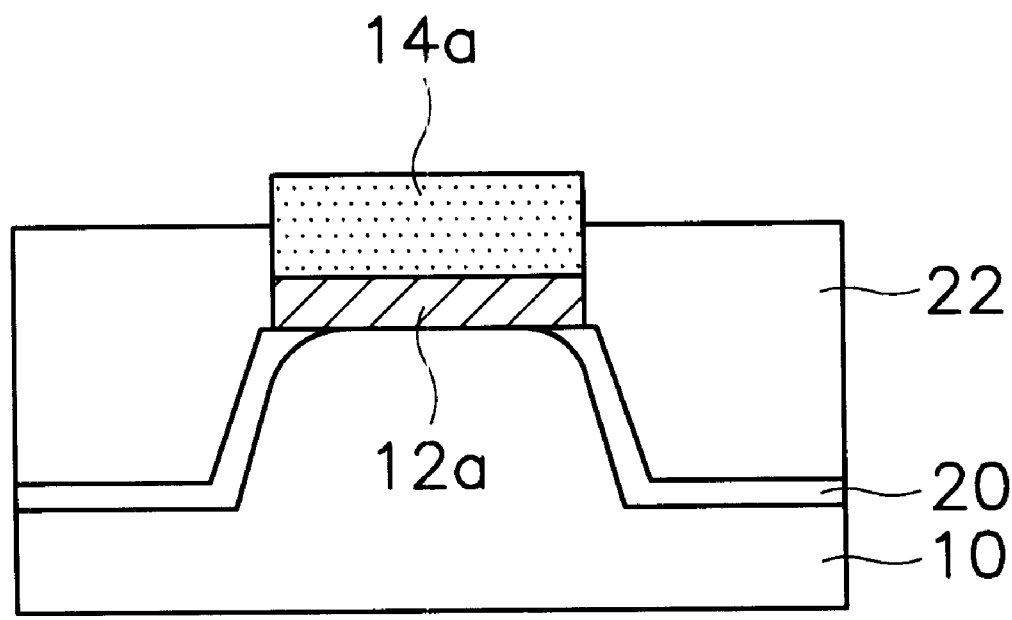
Figure 2A:
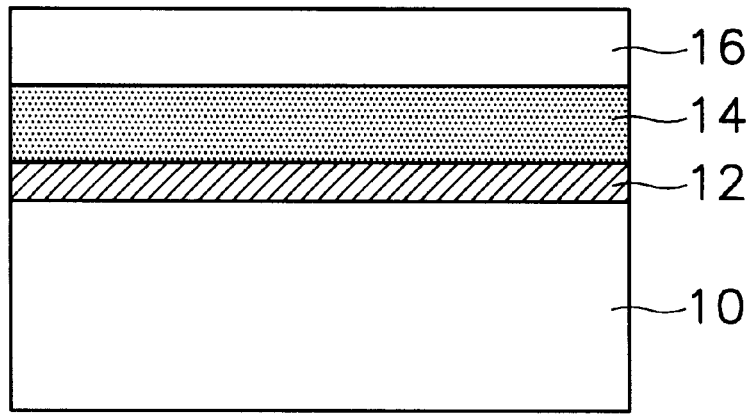
FIGS. 2A to 2G illustrate, in sectional views, a method for forming a field oxide film according to the present invention.
Figure 2B:
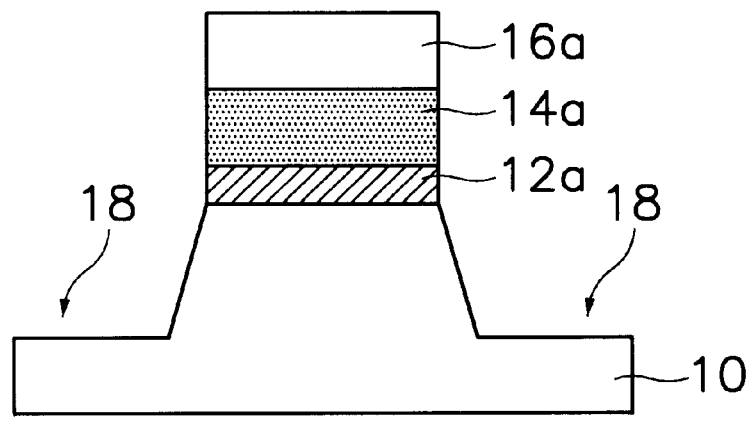

As illustrated in FIG. 2A, a pad oxide film 12 having a thickness of about 100 Å and a silicon nitride film 14 having a thickness of about 1000 Å are formed on a silicon substrate 10. The silicon nitride film 14 is then coated with a photoresist film 16. The photoresist film 16 is exposed and developed using a mask, e.g., a field oxide film mask, to form a photoresist pattern 16a, as illustrated in FIG. 2B. The silicon nitride film 14 and the pad oxide film 12 are then removed, preferably sequentially, using the photoresist pattern 16a as a mask to form a thermal oxidation mask, which comprises a silicon nitride film pattern 14a and a pad oxide film pattern 12a. Afterwards, the exposed silicon substrate 10 is removed to a desired depth using the thermal oxidation mask, which comprises the photoresist pattern 16a, to form a channel 18.

Figure 2C:
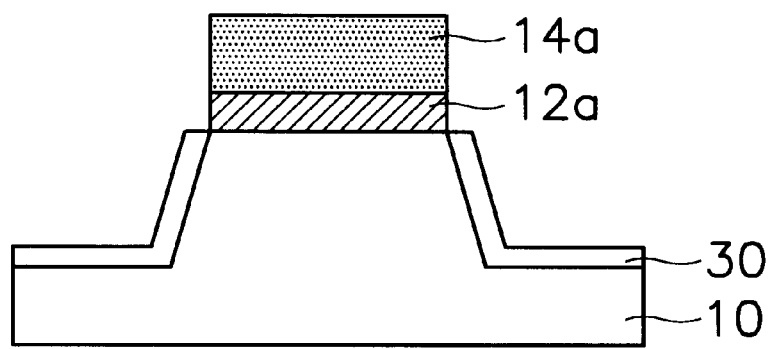
Figure 2D:
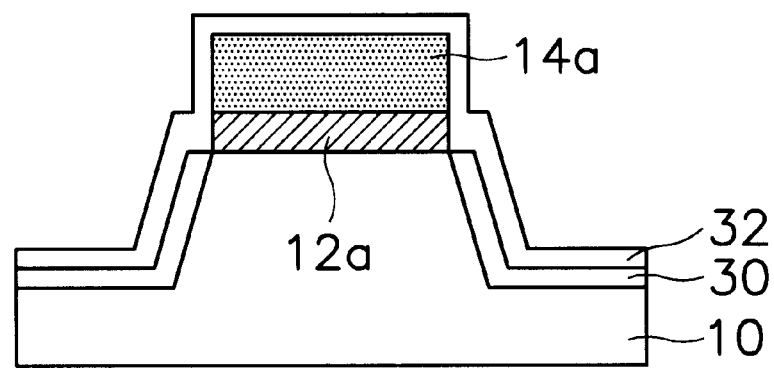
Figure 2E:
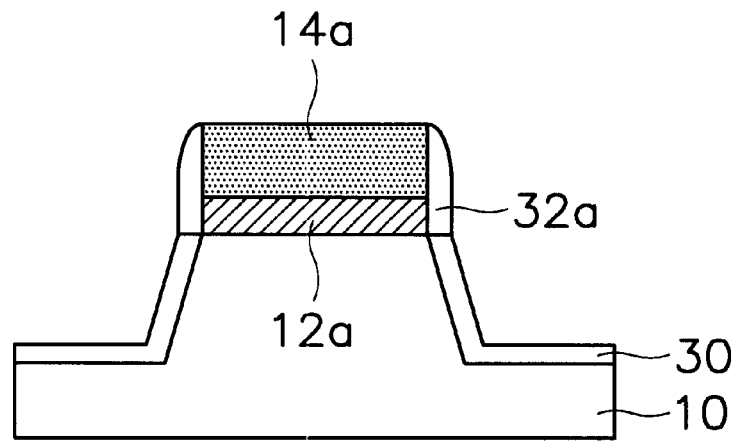
Figure 2F:
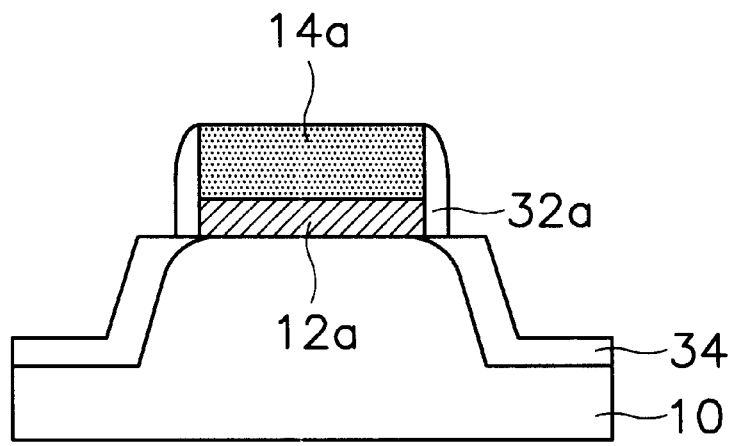

The photoresist pattern 16a is removed and a silicon epitaxial layer 30 is produced on the exposed surface of the channel 18, as shown in FIG. 2C. Preferably, the silicon epitaxial layer thickness is from about 50 to about 100 Å. Thereafter, a silicon oxide film 32 is produced, e.g., by a chemical vapor deposition (CVD) method, on the surface of the structure. See FIG. 2D. Preferably, the thickness of the silicon oxide film 32 is from about 50 to about 100 Å. The silicon oxide film 32 is then removed, e.g., by etching, such that a spacer 32a is produced on the side surfaces of the silicon nitride film pattern 14a and the pad oxide film pattern 12a, as shown in FIG. 2E. Thereafter, the "corner portions" of the silicon epitaxial layer 30 in the channel 18, i.e., near the interface between the spacer 32a and the silicon epitaxial layer 30, are exposed, e.g., by etching.

Thermally oxidation of the "corner portions" of the silicon epitaxial layer 30 then produces smooth edged (i.e., rounded) corners. In addition, the oxidation process produces a silicon oxide film 34. See FIG. 2F. Since the silicon oxide film 34 is rounded only at the corner portions of the silicon epitaxial layer 30, a cell region is scarcely affected by the silicon oxide film 34.

Figure 2G:
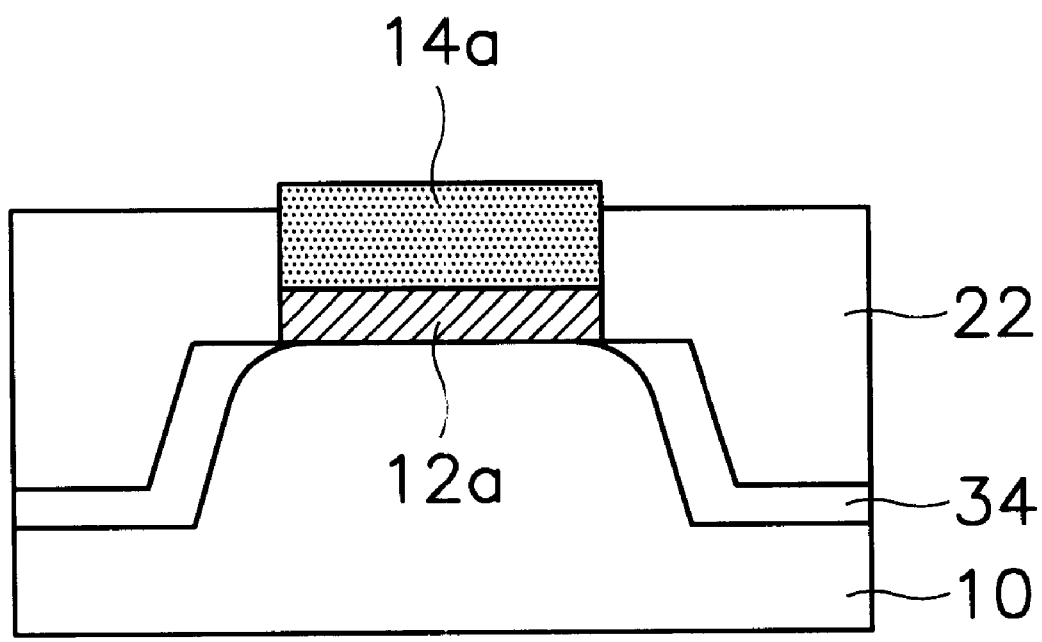

A field oxide film 22 is then formed on the substrate surface, e.g., by a CVD method, covering the channel 18, as shown in FIG. 2G. The field oxide film 22 is then planarized, e.g, by a CMP process. Preferably, planarization of the field oxide film 22 is achieved using the silicon nitride film 14a as an etching stop film, i.e., etching stop indicator. The silicon nitride film pattern 14a can then be removed by a wet etching process.

As mentioned above, methods of the present invention for forming a field oxide film on a semiconductor device have various advantages. For example, the amount of active region lost during the formation of rounded corners of the channels, e.g., during STI process, is reduced relative to conventional methods. Accordingly, reduction of the cell current due to the active region loss is also minimized. In addition, by using the silicon epitaxial layer as a boron doping layer the doping concentration in the corner portion of the active region can be increased. This can reduce threshold voltage drop due to Inverse Narrow Effect (INWE). Furthermore, the thickness of silicon oxide film, which can be formed by a CVD method, and the thickness of the spacer can be controlled. Moreover, coverage of the gap (i.e., channel) with silicon oxide prior to a round channel corner producing process is optional and can be eliminated. This elimination of silicon oxide coverage step simplifies the semiconductor device fabrication process.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for forming a field oxide film on a semiconductor device comprising the steps of:
   producing a thermal oxidation mask on a silicon substrate;
   producing a channel on said silicon substrate using said thermal oxidation mask;
   producing a silicon epitaxial layer on the surface of said silicon substrate channel;
   producing a spacer mask on side surfaces of said thermal oxidation mask;
   producing a smooth edged silicon epitaxial layer near the interface between said spacer mask and said silicon epitaxial layer; and
   producing a field oxide film on said silicon substrate.

2. The method of claim 1, wherein said thermal oxidation mask comprises silicon nitride film.

3. The method of claim 2, wherein said thermal oxidation mask further comprises a pad oxide film disposed between said silicon substrate and said silicon nitride film.

4. The method of claim 1, wherein said spacer mask comprises silicon oxide.

5. The method of claim 4, wherein said step of producing smooth edged silicon epitaxial layer comprises the steps of oxidizing said silicon epitaxial layer under conditions sufficient to form a layer of silicon oxide film on said silicon epitaxial layer and said smooth edged silicon epitaxial layer near the interface between said spacer mask and said silicon epitaxial layer.

6. The method of claim 1, wherein the thickness of said silicon epitaxial layer is from about 50 to about 100 Å.

7. The method of claim 1, wherein said step of producing spacer mask comprises coating said silicon substrate with a silicon oxide film and removing said silicon oxide film under conditions sufficient to produce said spacer mask.

8. The method of claim 7, wherein the thickness of said silicon oxide film coating is from about 50 to about 100 Å.

9. The method of claim 2, wherein said step of producing field oxide film comprises the steps of:
   producing a layer of field oxide film material on said silicon substrate; and
   planarizing said field oxide film material using said silicon nitride film as an etching stop film.

10. The method of claim 9, wherein said step of planarizing field oxide film material comprises a CMP process.

11. A method for forming a field oxide film on a semiconductor device comprising the steps of:

forming a thermal oxidation mask on a silicon substrate, wherein said thermal oxidation mask comprises silicon nitride film;

forming a channel on the exposed regions of said silicon substrate;

forming a silicon epitaxial layer on the surface of said silicon substrate channel;

forming an oxide film spacer mask on side surfaces of said thermal oxidation mask;

forming a smooth edged silicon epitaxial layer near the interface between said oxide film spacer mask and said silicon epitaxial layer by oxidizing the exposed silicon epitaxial layer; and forming a field oxide film on said silicon substrate.

12. The method of claim 11, wherein said thermal oxidation mask further comprises a pad oxide film disposed between said silicon substrate and said silicon nitride film.

13. The method of claim 11, wherein the thickness of said silicon epitaxial layer is from about 50 to about 100 Å.

14. The method of claim 11, wherein said step of forming oxide film spacer mask comprises coating said silicon substrate with a silicon oxide film and removing said silicon oxide film under conditions sufficient to produce said oxide film spacer mask.

15. The method of claim 14, wherein the thickness of said silicon oxide film coating is from about 50 to about 100 Å.

16. The method of claim 11, wherein said step of forming field oxide film comprises the steps of:

forming a layer of field oxide film material on said silicon substrate; and planarizing said field oxide film material using said silicon nitride film as an etching stop film.

17. The method of claim 16, wherein said step of planarizing field oxide film material comprises a CMP process.

* * * * *